(12) United States Patent
Booth, Jr. et al.

(10) Patent No.: US 8,030,736 B2
(45) Date of Patent: Oct. 4, 2011

(54) FIN ANTI-FUSE WITH REDUCED PROGRAMMING VOLTAGE

(75) Inventors: Roger A. Booth, Jr., Wappingers Falls, NY (US); Kangguo Cheng, Guilderland, NY (US); Chandrasekharan Kothandaraman, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 12/538,381

(22) Filed: Aug. 10, 2009

(65) Prior Publication Data

US 2011/0031582 A1 Feb. 10, 2011

(51) Int. Cl.
*H01L 23/52* (2006.01)
*H01L 21/82* (2006.01)

(52) U.S. Cl. .................. 257/530; 257/50; 257/E23.147; 438/131; 438/467; 438/600

(58) Field of Classification Search .................. 257/50, 257/209, 529, 530, E21.592, E23.147; 438/131, 438/132, 215, 281, 333, 467, 600, 601
See application file for complete search history.

(56) References Cited

U.S. PATENT DOCUMENTS

| | | | |
|---|---|---|---|
| 5,166,556 A | 11/1992 | Hsu et al. | |
| 5,328,865 A | 7/1994 | Boardman et al. | |
| 5,821,558 A | 10/1998 | Han et al. | |
| 6,156,588 A | 12/2000 | Sanchez et al. | |
| 6,525,399 B2 | 2/2003 | Cutter et al. | |
| 6,716,678 B2 | 4/2004 | Lehr et al. | |
| 7,087,499 B2 * | 8/2006 | Rankin et al. | 438/412 |
| 7,265,013 B2 | 9/2007 | Furukawa et al. | |
| 2004/0023441 A1 * | 2/2004 | Trivedi | 438/131 |
| 2006/0076643 A1 | 4/2006 | Breitwisch et al. | |
| 2006/0128207 A1 | 6/2006 | Zhang et al. | |
| 2006/0145297 A1 | 7/2006 | Lee | |
| 2007/0029576 A1 | 2/2007 | Nowak et al. | |
| 2008/0001176 A1 | 1/2008 | Gopalakrishnan et al. | |

* cited by examiner

*Primary Examiner* — Victor A Mandala
*Assistant Examiner* — Scott Stowe
(74) *Attorney, Agent, or Firm* — Gibb I.P. Law Firm, LLC

(57) ABSTRACT

A method forms an anti-fuse structure comprises a plurality of parallel conductive fins positioned on a substrate, each of the fins has a first end and a second end. A second electrical conductor is electrically connected to the second end of the fins. An insulator covers the first end of the fins and a first electrical conductor is positioned on the insulator. The first electrical conductor is electrically insulated from the first end of the fins by the insulator. The insulator is formed to a thickness sufficient to break down on the application of a predetermined voltage between the second electrical conductor and the first electrical conductor and thereby form an uninterrupted electrical connection between the second electrical conductor and the first electrical conductor through the fins.

25 Claims, 16 Drawing Sheets

US 8,030,736 B2

FIN ANTI-FUSE WITH REDUCED PROGRAMMING VOLTAGE

BACKGROUND

1. Field of the Invention

The invention generally relates to a method of forming an antifuse and the resulting structure which includes a fin structure that can be converted from an insulator into a permanent conductor through a heating process.

2. Description of the Related Art

Fuses and antifuses are useful in today's integrated circuit devices to selectively connect and disconnect devices from other portions of the circuit, as well as to provide logical operations. For example, a fuse is often activated (blown, opened, etc.) in order to disrupt or break an electrical connection. Similarly, a fuse can be blown to dramatically increase the resistance of a circuit, thereby providing a logical distinction between the activated and unactivated fuse device.

Antifuses operate in an opposite manner to that of fuses. Thus, antifuses are generally non-conductive (highly resistive) when unactivated (unblown) and become conductors when activated (blown). Therefore, when an antifuse is activated, it forms an electrical connection, as opposed to a fuse which breaks an electrical connection when activated. Thus, an antifuse selectively allows a conductive connection to be made to selectively connect portions of a circuit together, thereby potentially engaging a previously disconnected device into a circuit. Similarly, an antifuse provides different resistance values which can be utilized to perform logical operations.

Once a fuse or antifuse is activated, the fuse generally cannot be unactivated. Therefore, the activation is generally a one-time event and is used to permanently modify a circuit. Low process cost and relatively high density are required for fuses and antifuses. Electrically blowing metal fuses is one conventional method for activating a fuse, but requires precise electrical and physical control to be reliable. The invention described below provides much smaller and easily activated antifuses and methods for making the same.

SUMMARY

In view of the foregoing, disclosed herein is an anti-fuse structure comprising: a substrate; a plurality of parallel conductive fins positioned on the substrate, each of the fins having a first end and a second end; an insulator covering the first end of the fins; a first electrical conductor positioned on the insulator, the first electrical conductor being electrically insulated from the first end of the fins by the insulator; and a second electrical conductor electrically connected to the second end of the fins, the insulator having a thickness sufficient to break down on the application of a predetermined voltage between said second electrical conductor and the first electrical conductor and thereby form an uninterrupted electrical connection between the second electrical conductor and the first electrical conductor through the fins.

Also disclosed herein is an anti-fuse structure comprising: a substrate having an upper surface; a plurality of parallel conductive fins positioned on the upper surface of the substrate, each of the fins having a rectangular prism shape comprising: a length dimension parallel to the upper surface; a height dimension perpendicular to the length dimension; and a width dimension perpendicular to the length dimension and to the height dimension, the length dimension being greater than the height dimension, and the height dimension being greater than the width dimension, the width dimension contacting the upper surface of the substrate, and the length dimension of the fins having a first end and a second end; an insulator covering the first end of the fins; a first electrical conductor positioned on the insulator, the first electrical conductor being electrically insulated from the first end of the fins by the insulator; and a second electrical conductor electrically connected to the second end of the fins, the insulator having a thickness sufficient to break down on the application of a predetermined voltage between the second electrical conductor and the first electrical conductor and thereby form an uninterrupted electrical connection between said second electrical conductor and the first electrical conductor through the fins.

Also disclosed is an anti-fuse structure comprising: a substrate having an upper surface; a plurality of parallel conductive fins positioned on the upper surface of the substrate, each of the fins having a rectangular prism shape comprising: a length dimension parallel to the upper surface; a height dimension perpendicular to the length dimension; and a width dimension perpendicular to the length dimension and to the height dimension, the length dimension being greater than the height dimension, and the height dimension being greater than the width dimension, and the length dimension of the fins having a second end and a first end, each of the fins having a bottom surface connected to the upper surface of the substrate and a top surface opposite the bottom surface; an insulator covering the first end of the fins, each of the fins having sides between the bottom surface and the top surface, the insulator covering the top surface and the sides of the first end of the fins; a first electrical conductor positioned on the insulator, the first electrical conductor being electrically insulated from the first end of the fins by the insulator; and a second electrical conductor electrically connected to the second end of the fins, the second electrical conductor being connected to the top surface of the second end of the fins, the insulator having a thickness sufficient to break down on the application of a predetermined voltage between the second electrical conductor and the first electrical conductor and thereby form an uninterrupted electrical connection between the second electrical conductor and the first electrical conductor through the fins.

Also disclosed herein is a method of forming an anti-fuse structure comprising: patterning a plurality of parallel conductive fins on a substrate, each of the fins having a first end and a second end; forming an insulator on the fins; forming a first electrical conductor on the insulator over the first end of the fins, the first electrical conductor being electrically insulated from the first end of the fins by the insulator; removing the insulator from the second end of the fins to expose the second end of the fins; and forming a second electrical conductor on the second end of the fins, the insulator having a thickness sufficient to break down on the application of a predetermined voltage between the second electrical conductor and the first electrical conductor and thereby form an uninterrupted electrical connection between the second electrical conductor and the first electrical conductor through the fins.

Also disclosed herein is a method of forming an anti-fuse structure comprising: patterning a plurality of parallel conductive fins on a substrate, such that each of said fins has a rectangular prism shape comprising: a length dimension parallel to said upper surface; a height dimension perpendicular to said length dimension; and a width dimension perpendicular to said length dimension and to said height dimension, said length dimension being greater than said height dimension, and said height dimension being greater than said width dimension, said width dimension contacting said upper surface of said substrate, and said length dimension of said fins having a first end and a second end; forming an insulator on said fins; forming a first electrical conductor on said insulator over said first end of said fins, said first electrical conductor being electrically insulated from said first end of said fins by said insulator; removing said insulator from said second end of said fins to expose said second end of said fins; and forming a second electrical conductor on said second end of said fins, said insulator having a thickness sufficient to break down on the application of a predetermined voltage between said second electrical conductor and said first electrical conductor and thereby form an uninterrupted electrical connection between said second electrical conductor and said first electrical conductor through said fins.

BRIEF DESCRIPTION OF THE DRAWINGS

The embodiments of the invention will be better understood from the following detailed description with reference to the drawings, which are not necessarily drawn to scale and in which.

DETAILED DESCRIPTION

The embodiments of the invention and the various features and advantageous details thereof are explained more fully with reference to the non-limiting embodiments that are illustrated in the accompanying drawings and detailed in the following description.

As mentioned above, antifuses are a valuable device for array repair and other non-volatile memory applications. Current state of the art anti-fuses are typically capacitor structures which are broken down when programmed. This disclosure shows a structure for an anti-fuse in fin technology, which takes advantage of field enhancement for low programming voltage. The present embodiments are compatible with conventional fin-type field effect transistor (FinFET) processing, are compact in size, and require a low programming voltage.

Figure 8:
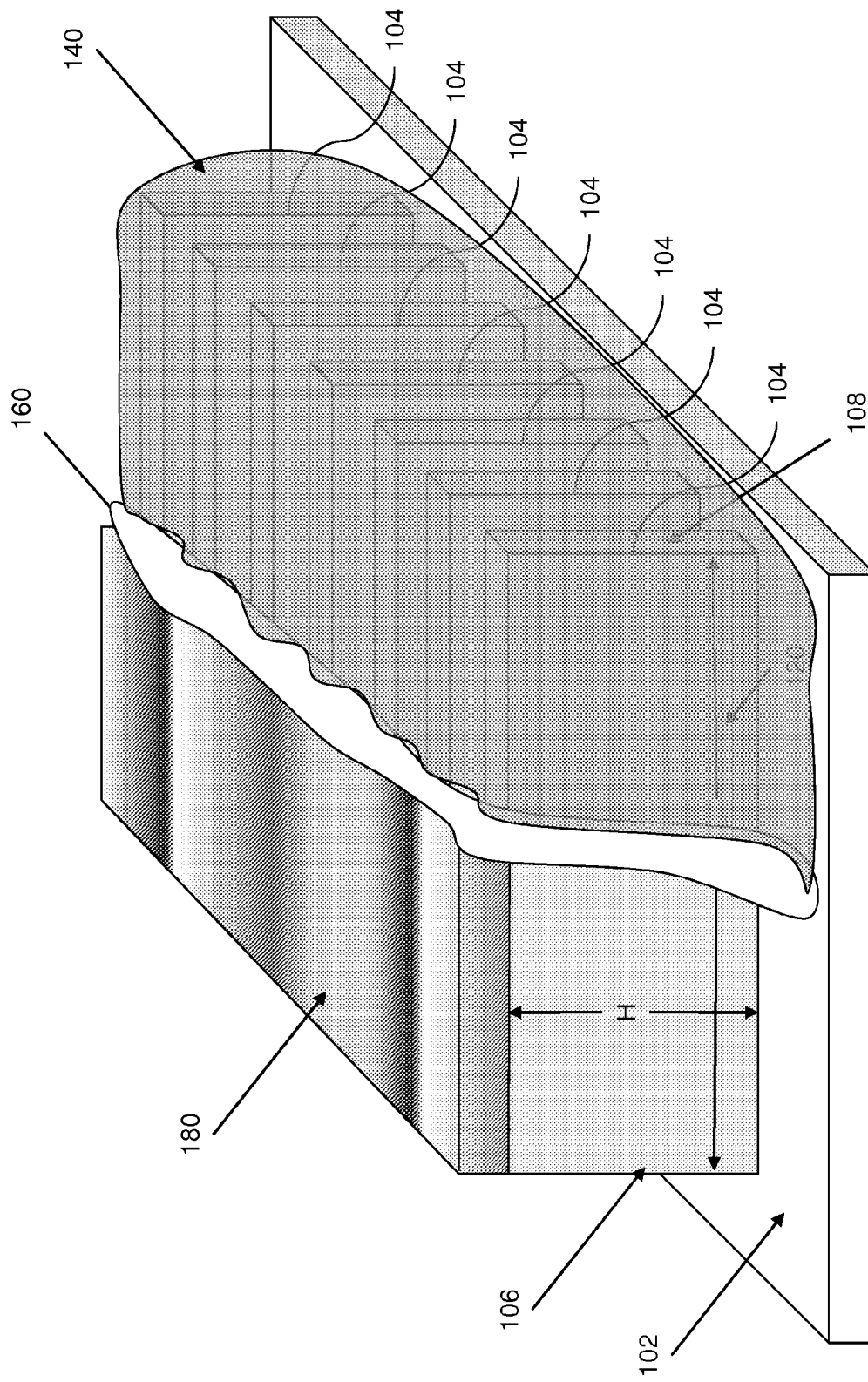
FIG. 8 is a schematic perspective diagram of a completed integrated circuit structure according to embodiments herein.
Figure 9:
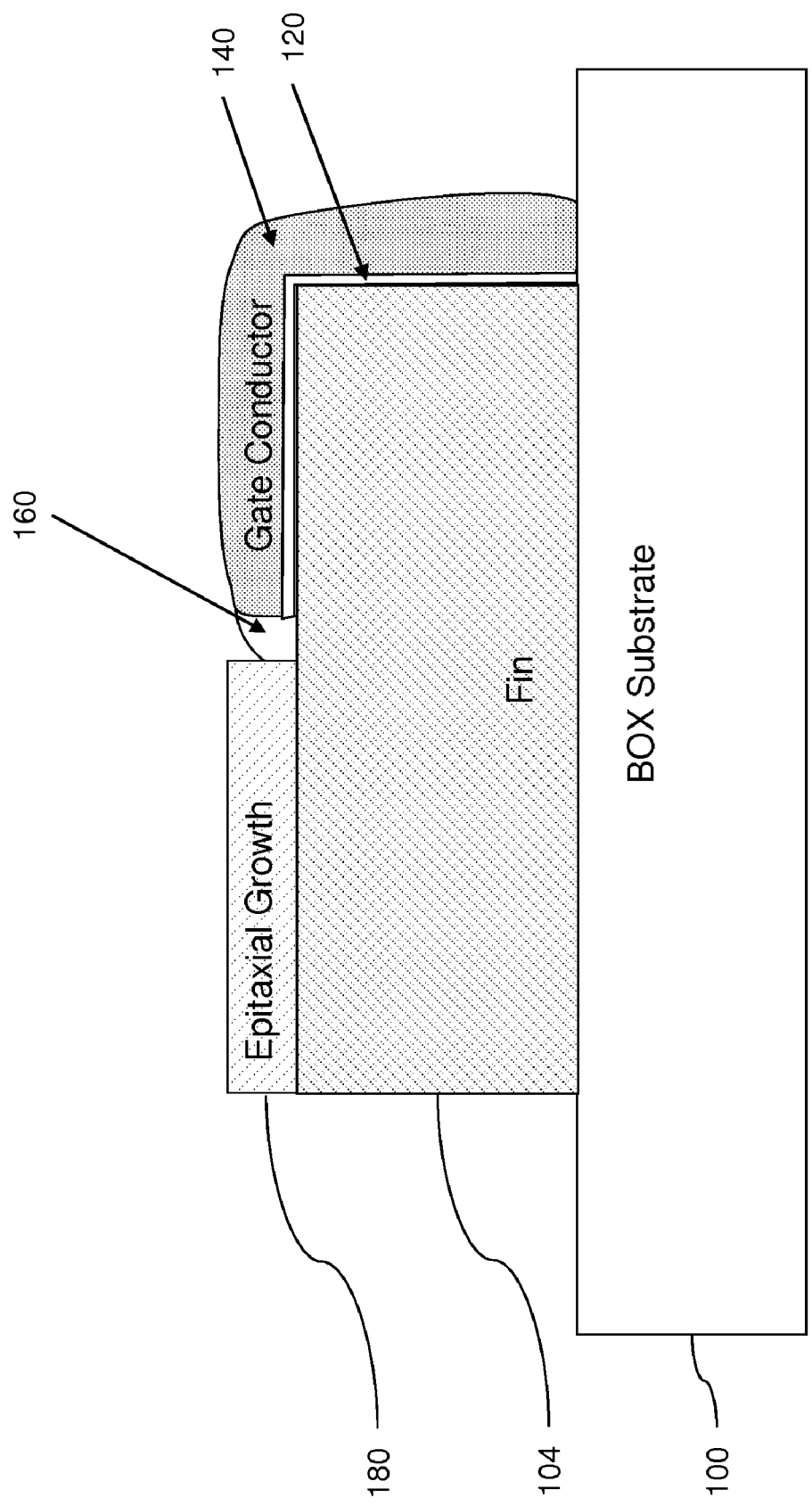
FIG. 9 is a schematic cross-sectional diagram of a completed integrated circuit structure according to embodiments herein.

As shown in FIGS. 1-14, a number of anti-fuse structures are provided. One completed structure is illustrated in FIGS. 8 and 9. A first electrical conductor 140 is positioned on the insulator 120. The first electrical conductor 140 is electrically insulated from the first end 108 of the fins 104 by the insulator 120. A second electrical conductor 180 is electrically connected to a second end 106 of conductive fins 104. An insulator 120 covers the first end 108 of the fins 104.

Each of the fins 104 has sides 118 between the bottom surface 114 and the top surface 116, and the insulator 120 covers the top surface 116 and the sides 118 of the first end 108 of the fins 104. The second electrical conductor 180 is connected to the top surface 116 and sides 118 of the second end 106 of the fins 104.

Further, the second electrical conductor 180 and the first electrical conductor 140 can comprise different materials. For example, the first electrical conductor 140 can be a deposited polysilicon, while the second electrical conductor 180 can be a material epitaxially grown from the fins 104.

As shown most clearly in FIG. 9, the insulator 120 has a thickness sufficient to (is thin enough to) break down on the application of a predetermined voltage between the second electrical conductor 180 and the first electrical conductor 140 and thereby form an uninterrupted electrical connection between the second electrical conductor 180 and the first electrical conductor 140 through the fins 104. For example, the thickness of the insulator 120 can be less than 5%, less than 3%, or even less than 1% of the height dimension (H) of the fins.

Figure 10:
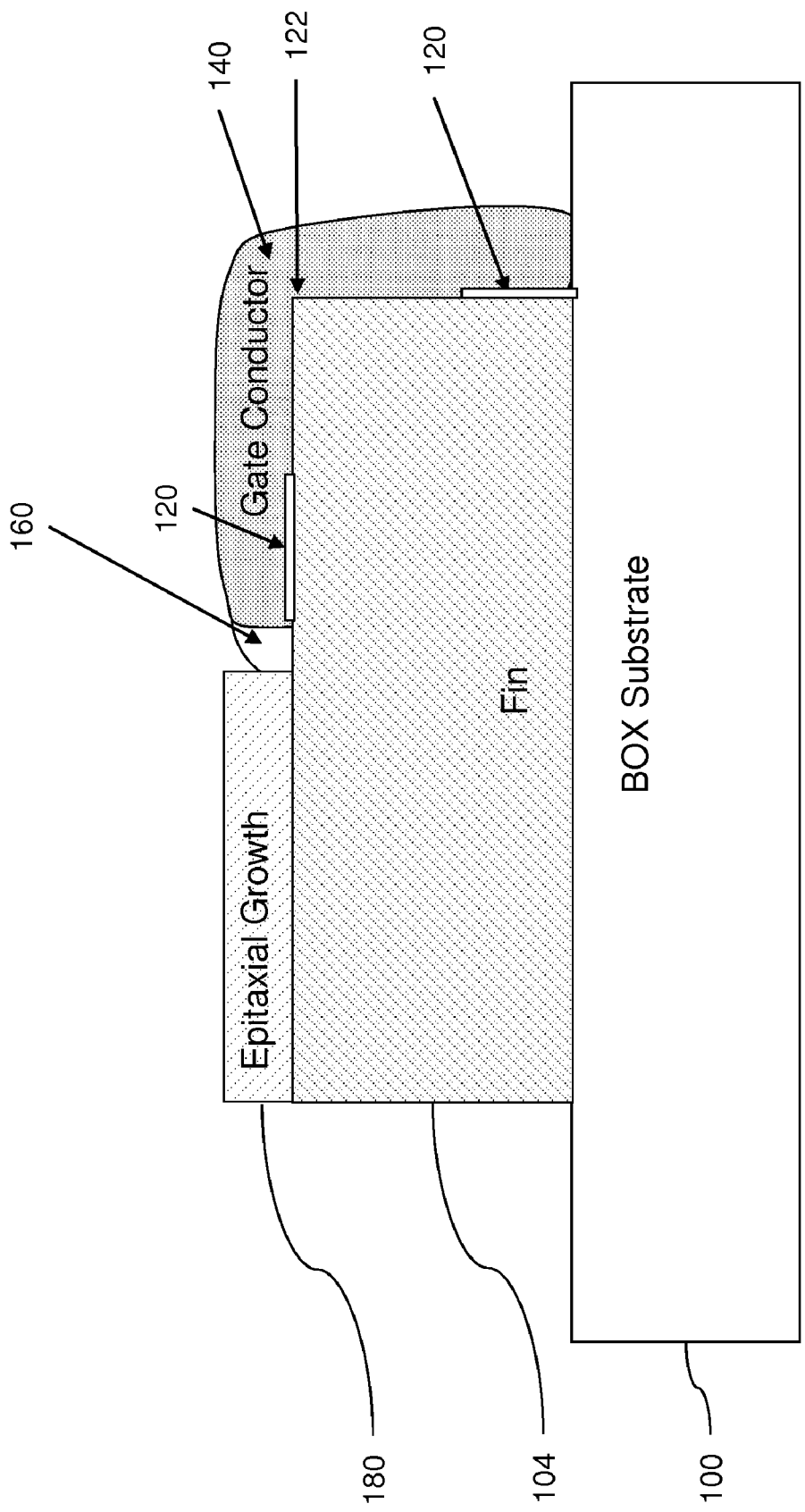
FIG. 10 is a schematic cross-sectional diagram of a completed integrated circuit structure according to embodiments herein.
Figure 11:
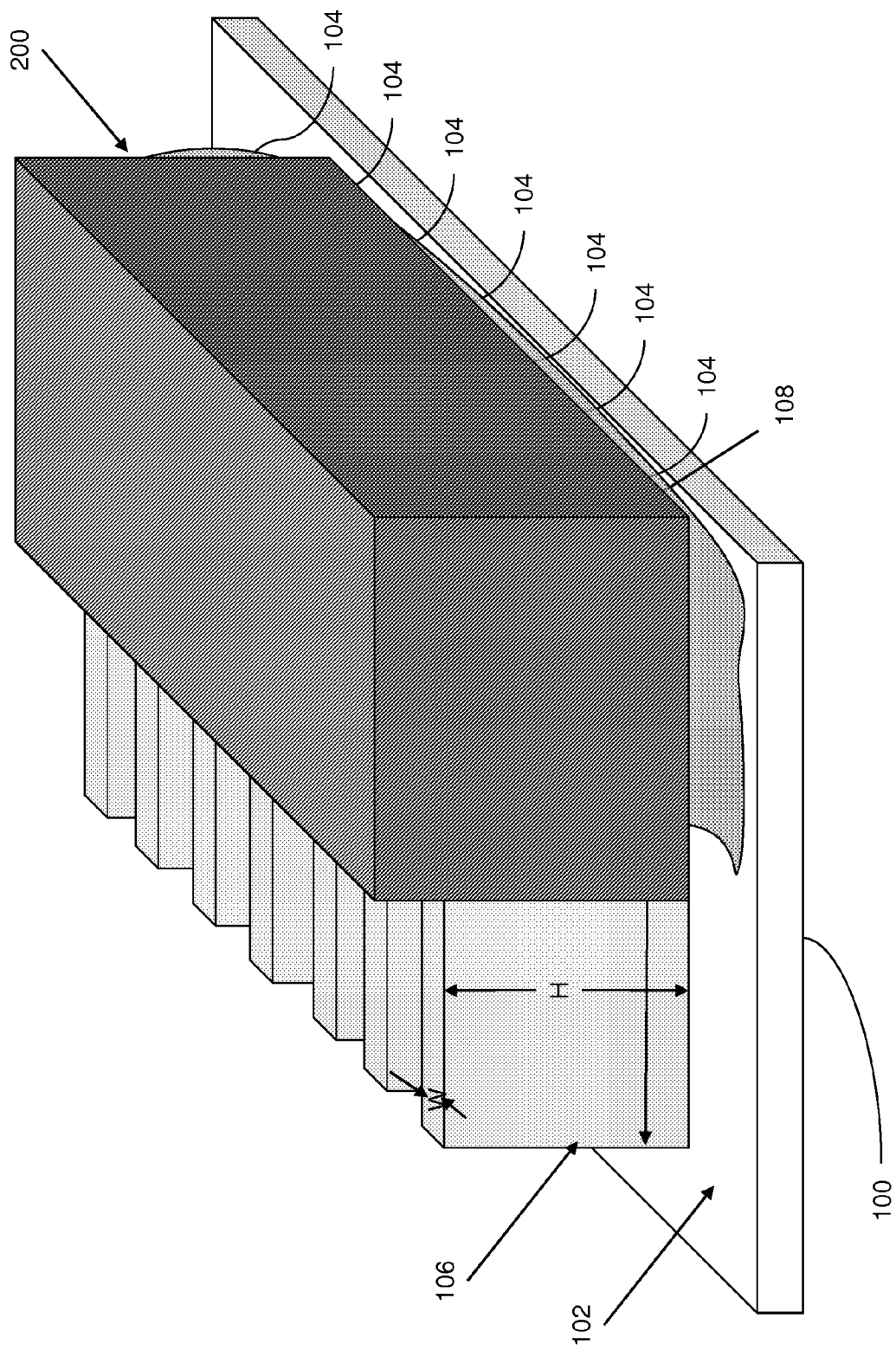
FIG. 11 is a schematic perspective diagram of a partially completed integrated circuit structure according to embodiments herein.
Figure 12:
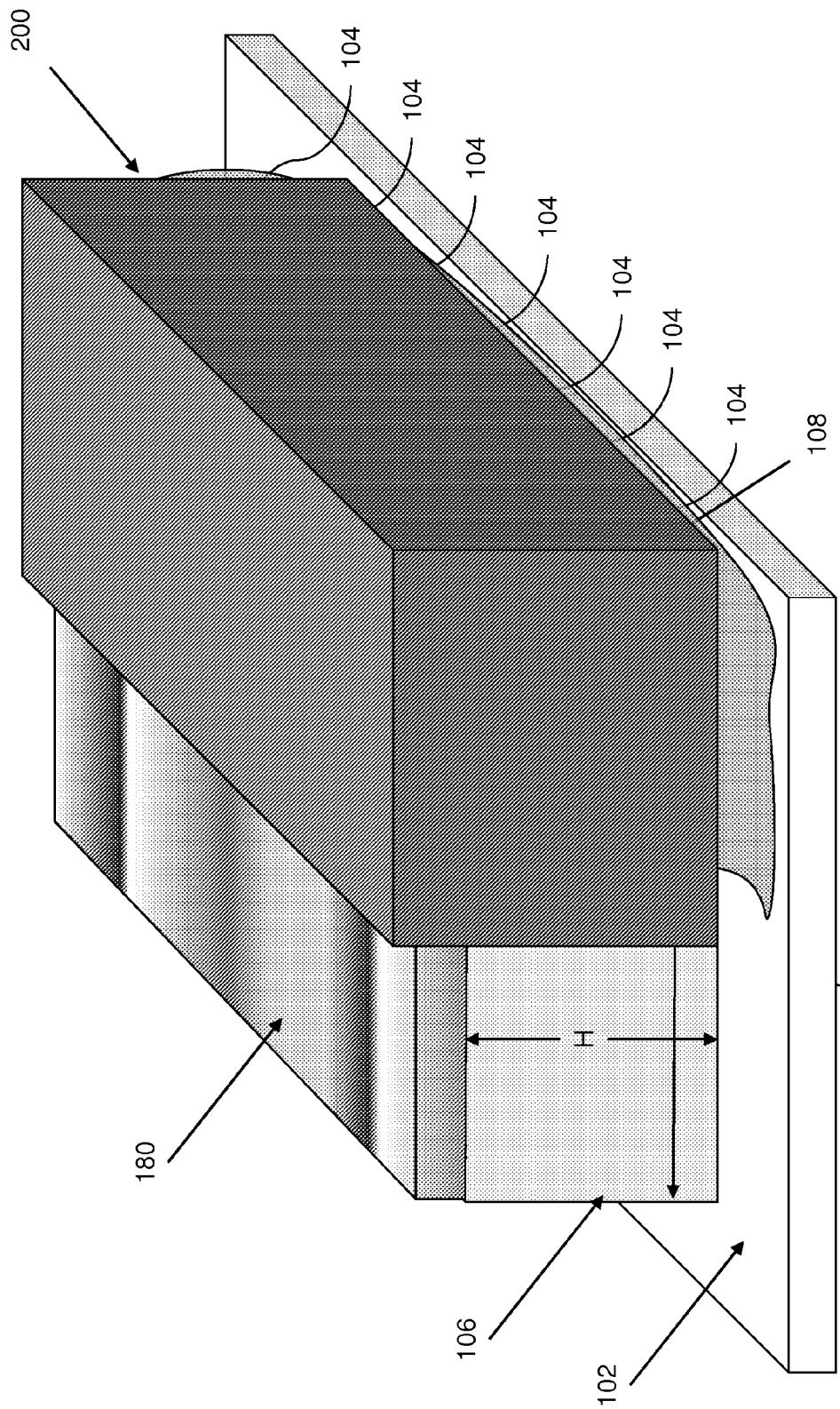
FIG. 12 is a schematic perspective diagram of a partially completed integrated circuit structure according to embodiments herein.

As shown in FIG. 10, the portion of the insulator 120 located at the corner 122 of the first end 108 of the fin 104 is the portion of the insulator 120 that breaks down most easily. The geometry of the fin corner 122 concentrates the heating action and promotes the insulator 120 breakdown, which reduces the amount of voltage required to "blow" the anti-fuse. By reducing the amount of voltage required to blow the anti-fuse, the embodiments herein provide a substantial advantage over conventional anti-fuse structures.

Figure 1:
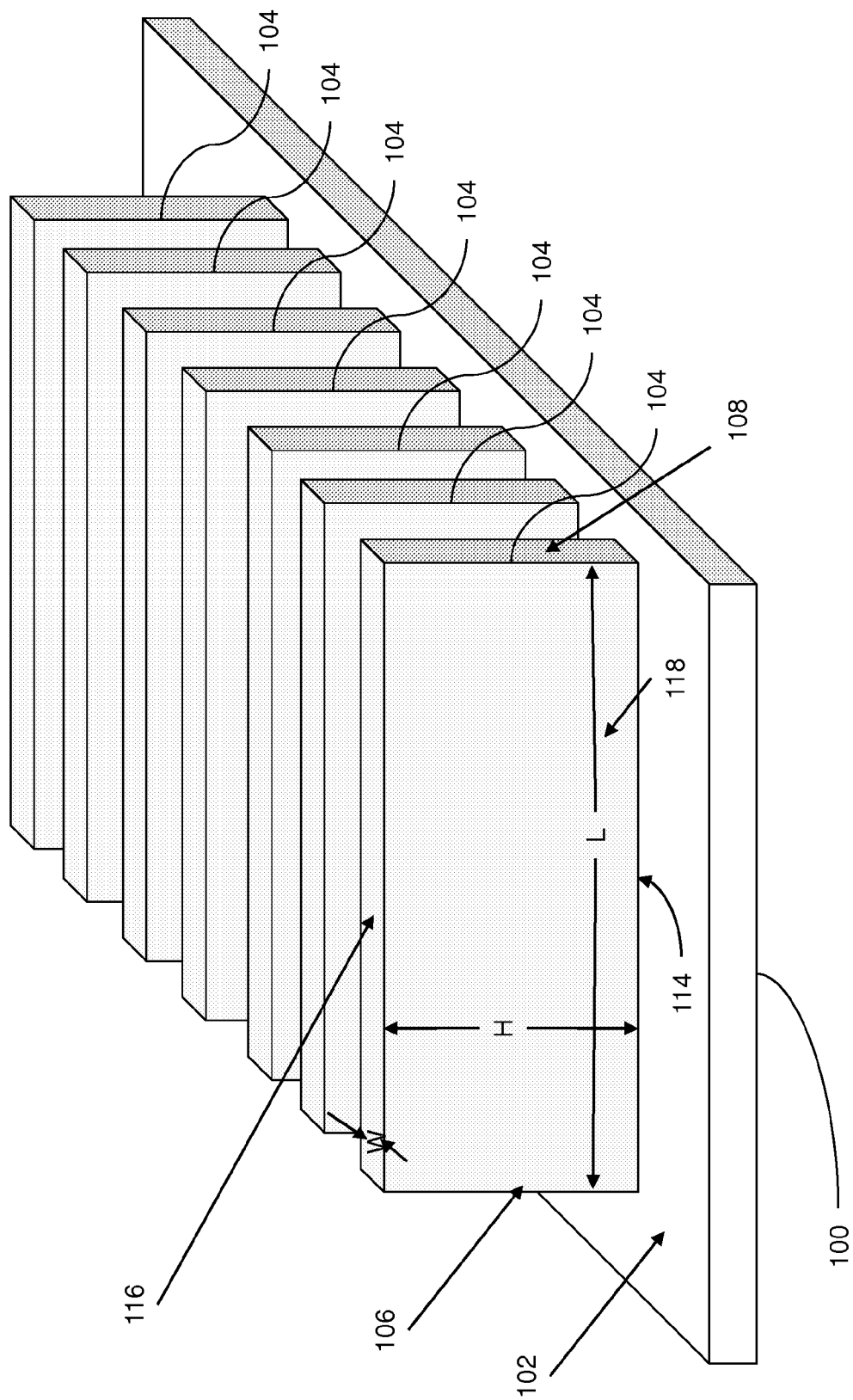
FIG. 1 is a schematic perspective diagram of a partially completed integrated circuit structure according to embodiments herein.

The structures shown in FIGS. 8 and 9 can be manufactured according to the any number of different processes, one of which is illustrated in FIGS. 1-9. As shown in FIG. 1, these structures include a substrate 100 having an upper surface 102 and a plurality of parallel conductive fins 104 positioned on the upper surface 102 of the substrate 100. Each of the fins 104 has a bottom surface 114 connected to the upper surface 102 of the substrate 100 and a top surface 116 opposite the bottom surface 114.

Each of the fins 104 has a rectangular prism shape comprising a length dimension (L) parallel to the upper surface 102, a height dimension (H) perpendicular to the length dimension (L), and a width dimension (W) perpendicular to the length dimension (L) and to the height dimension (H). The length dimension (L) is greater than the height dimension (H), and the height dimension (H) is greater than the width dimension (W). The length dimension (L) of the fins 104 has a second end 106 and a first end 108.

The fins 104 can be formed on the substrate 100 using any number of conventional methodologies. For example, the fin material can be deposited, a mask can be formed over the fin material and the fins can be patterned according to the pattern developed in the mask. Similarly, the fin material can be patterned using sidewall image transfer (SIT) processing. Such processes are well-known to those ordinarily skilled in the art and are not discussed in detail herein (see, for example, U.S. Pat. No. 7,265,013 the complete disclosure of which is incorporated herein by reference for more details about forming fins on substrates).

The fins 104 are either formed from a conductive material, such as a metal, alloy, polysilicon, etc., or are formed of a material (such as silicon) that is later doped with impurities to become a conductor. For example, if the fins 104 are formed from undoped silicon, they can be doped with impurities such as germanium, gallium arsenide, and silicon carbide so that the fins become fully conductive from the second end 106 to the first end 108.

Figure 2:
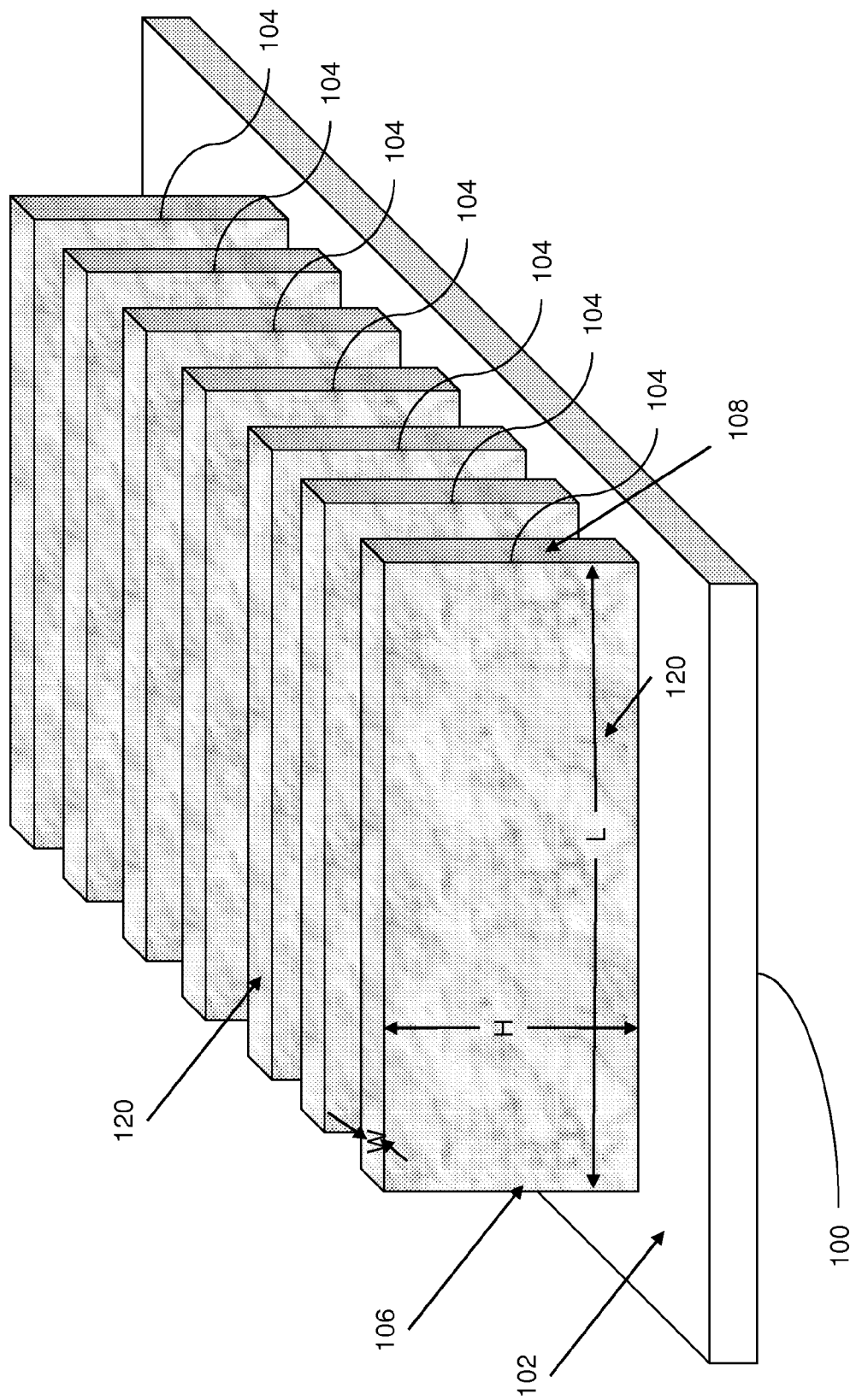
FIG. 2 is a schematic perspective diagram of a partially completed integrated circuit structure according to embodiments herein.

Then, as shown in FIG. 2, an insulator 120 is formed on all exposed services of the fins 104. The insulator 120 can be deposited on to the fins 104 using any common deposition technique (spin on processing, immersion processing, etc.) or can be grown on the fins 104 (as an oxide, etc.). For example any gate insulator formation process can be utilized to form the insulator 120 on the fins 104.

Figure 3:
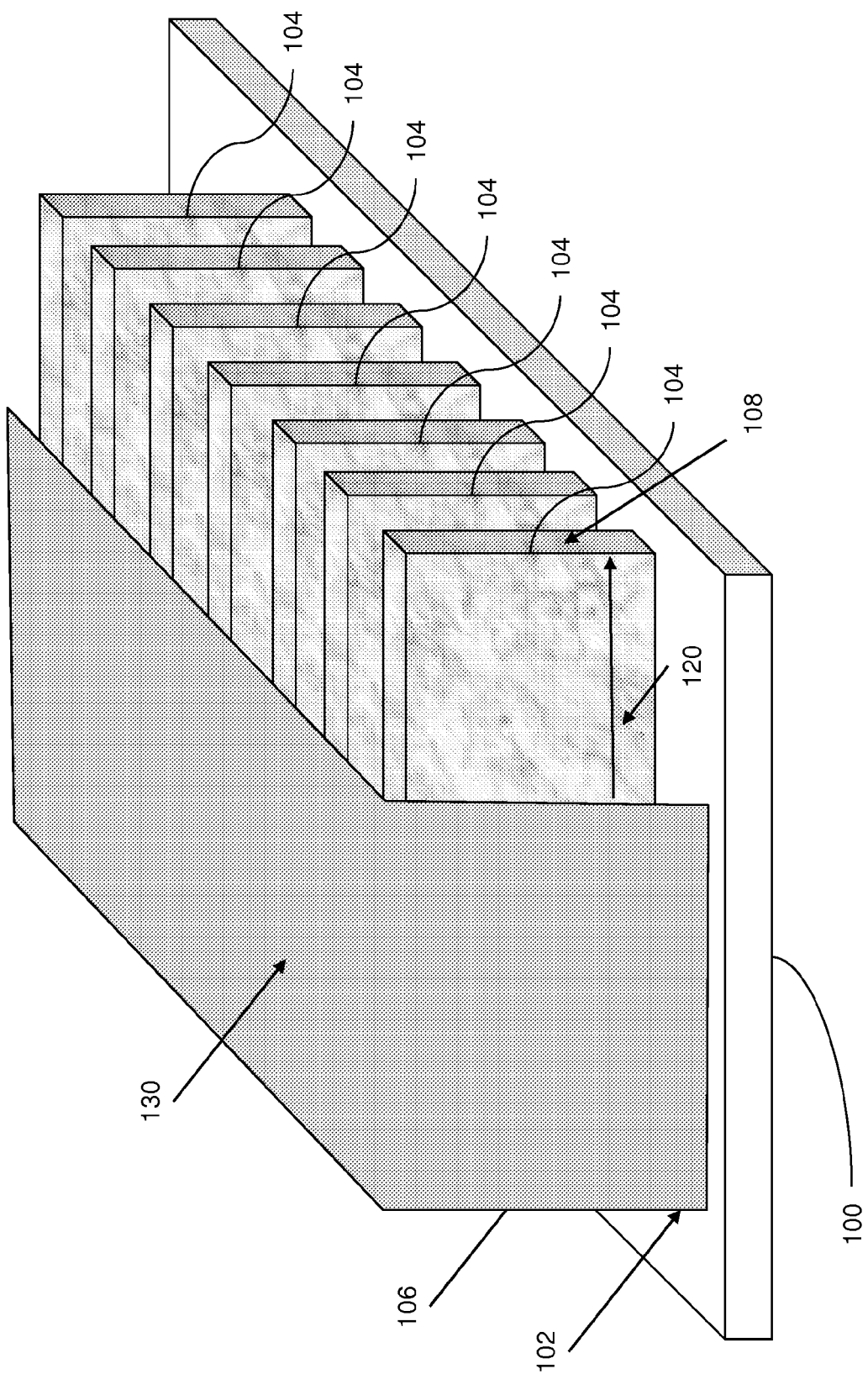
FIG. 3 is a schematic perspective diagram of a partially completed integrated circuit structure according to embodiments herein.

Next, as shown in FIG. 3, once the insulator 120 is formed, a mask 130 such as any easily patterned organic photoresist is patterned over the second end 106 of the fins 104. Item 130 can represent any type of mask and such items are well known to those ordinarily skilled in the art. For example, an organic photoresist can be deposited over the structure, exposed to a specific wavelength of light, and then developed to remove selected portions of the mask with 130.

Figure 4:
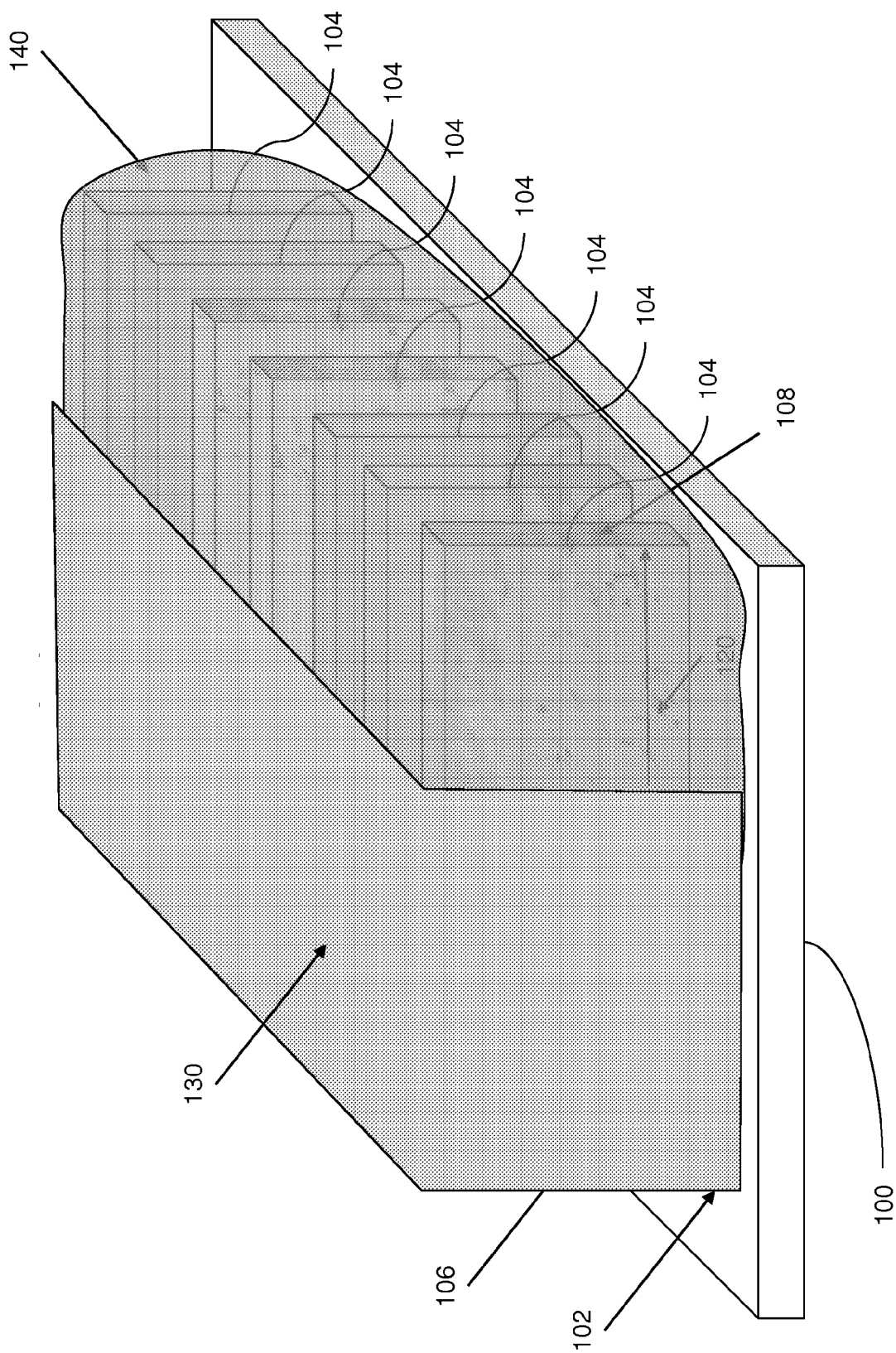
FIG. 4 is a schematic perspective diagram of a partially completed integrated circuit structure according to embodiments herein.

With the mask 130 in place, processing proceeds as shown in FIG. 4 to deposit or form the first conductor 140 on the insulator 120 that is positioned over the first end 108 of the fin 104. This conductor 104 can comprise any of the previously mentioned conductors, and is conformal so that it is formed and remains between an over each of the individual fins 104. In one example, the conductor 140 can comprise conformal polysilicon.

Figure 5:
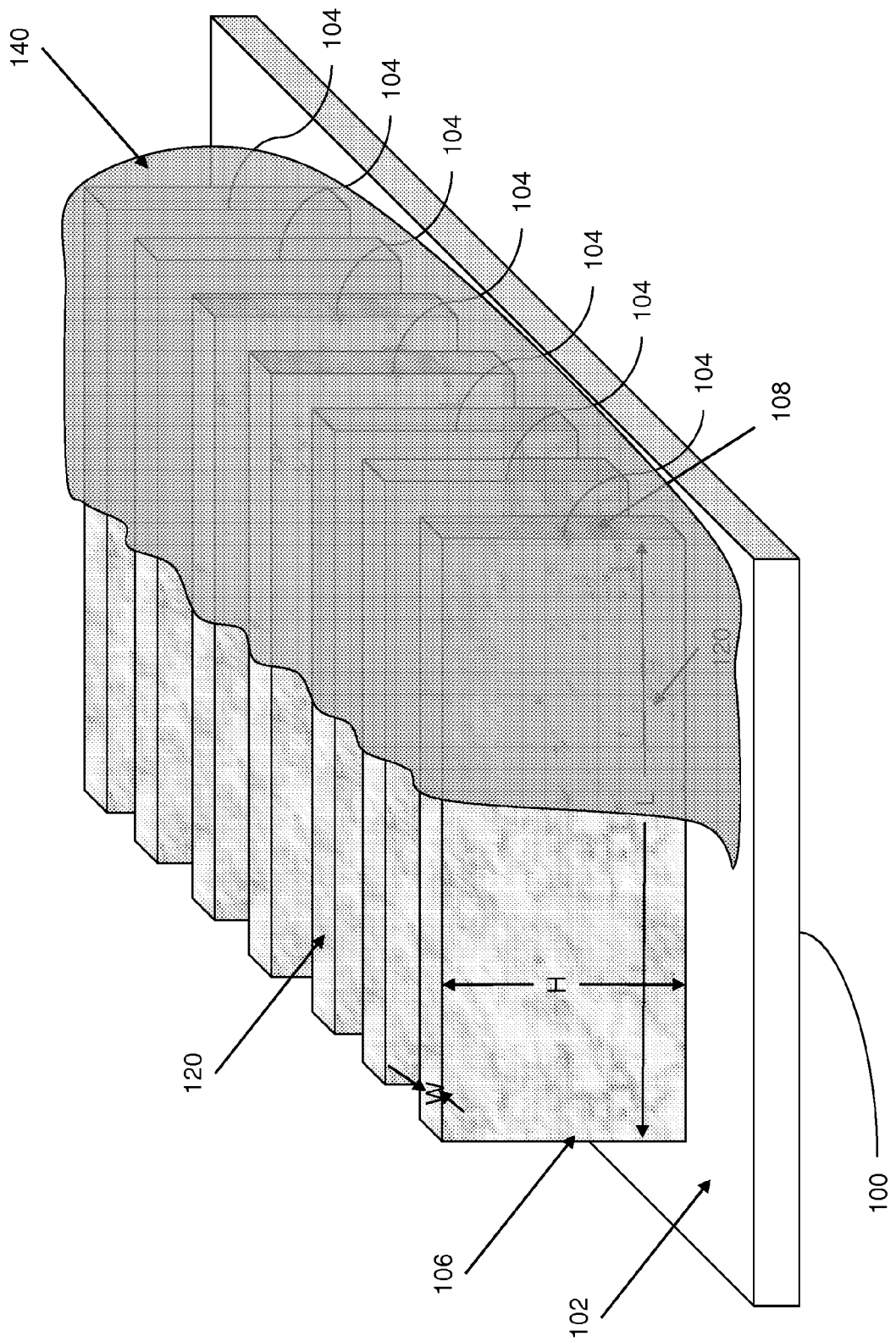
FIG. 5 is a schematic perspective diagram of a partially completed integrated circuit structure according to embodiments herein.
Figure 6:
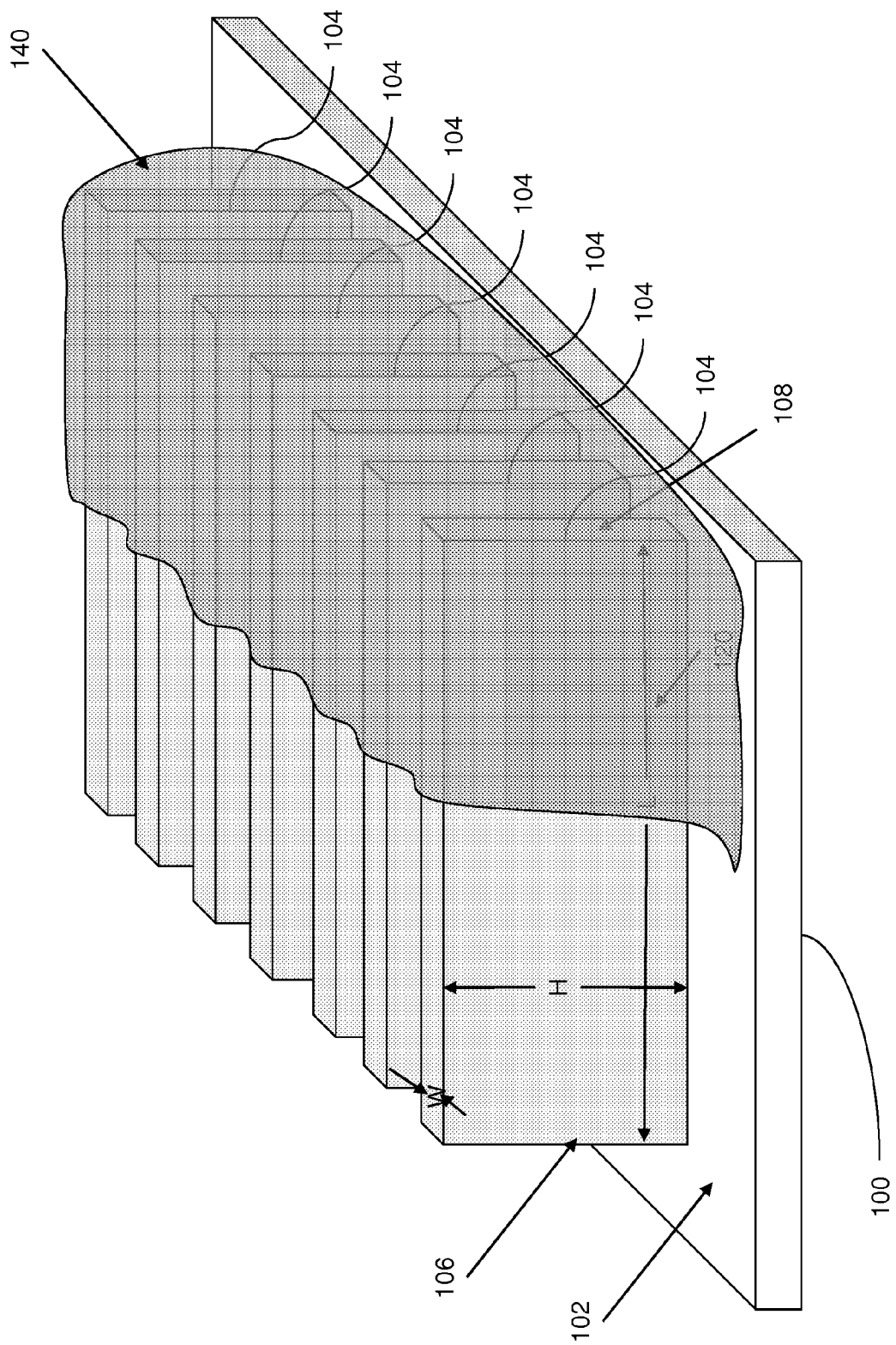
FIG. 6 is a schematic perspective diagram of a partially completed integrated circuit structure according to embodiments herein.

After the first conductor 140 is formed, the mask 130 is removed, as shown in FIG. 5, which leaves the insulator 120 positioned on the second half 106 of the fins 104 exposed. Then, as shown in FIG. 6, the insulator 120 is removed from the second end 106 of the fins 104 in a chemical rinsing process, etching process, etc. The removal process for the insulator 120 will vary depending upon the material composition of the insulator 120. Note that the insulator 120 remains on the first end 108 of the fins 104 and keeps the conductive fin 104 electrically insulated from the first conductor 140.

Figure 7:
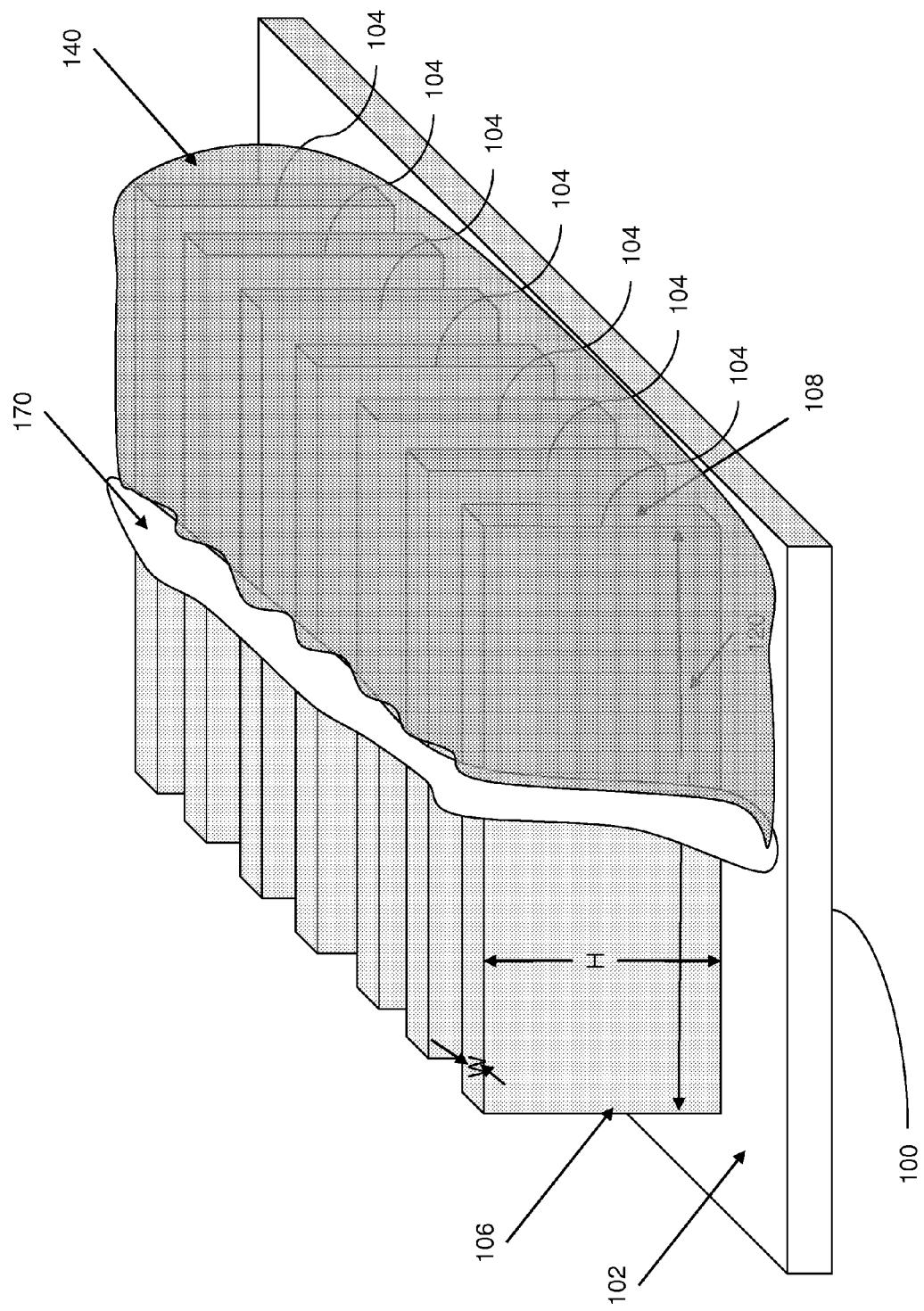
FIG. 7 is a schematic perspective diagram of a partially completed integrated circuit structure according to embodiments herein.

As shown in FIG. 7, an insulating sidewall 170 is next formed adjacent the first conductor 140. Note that while the insulating sidewall will be formed on all surfaces of the first conductor 140, only a portion of the insulating sidewall 170 is illustrated in the drawings that so as to reduce clutter within the drawings. Processes for forming insulating sidewalls are well-known to those ordinarily skilled in the art. Briefly, when forming sidewall structures, a conformal material is deposited over a structure and then removed in a selective material removal process that removes material from horizontal surfaces faster than it removes material from vertical surfaces, thereby leaving the material on the vertical sidewalls. The insulating material used within the insulating sidewall 170 can comprise any conventionally known insulator, such as oxides, nitride, etc. or any of the insulators mentioned above.

In FIG. 8, the second conductor 180 is formed. This conductor can comprise any well-known conductor (such as those mentioned above) and, in one embodiment can be formed by epitaxially growing additional material from the conductive material of the fins 104. More specifically, an epitaxial growth process is initiated (in the appropriate growth environment) to form the second conductor 180 from the exposed areas of the fins (the second end 106 of the fins 104 that are not protected by the second conductor 140 or the sidewall spacers 160). The same structure is shown in cross-sectional view along the length direction (L) of one of the fins 104 in FIG. 9. Note that in both FIGS. 8 and 9, there is not a conductive path between the second conductor 180 and the first conductor 140 because the conductive path is blocked by the insulating sidewall spacer 160 and the insulator 120. As mentioned above, FIG. 10 illustrates the anti-fuse structure after the anti-fuse has been programmed or blown, where a sufficient voltage have been applied between the second conductor 180 and the first conductor 140 to break down of the insulator 120, thereby allowing a conductive path to be formed between the second conductor 180 and the first conductor 140.

Figure 13:
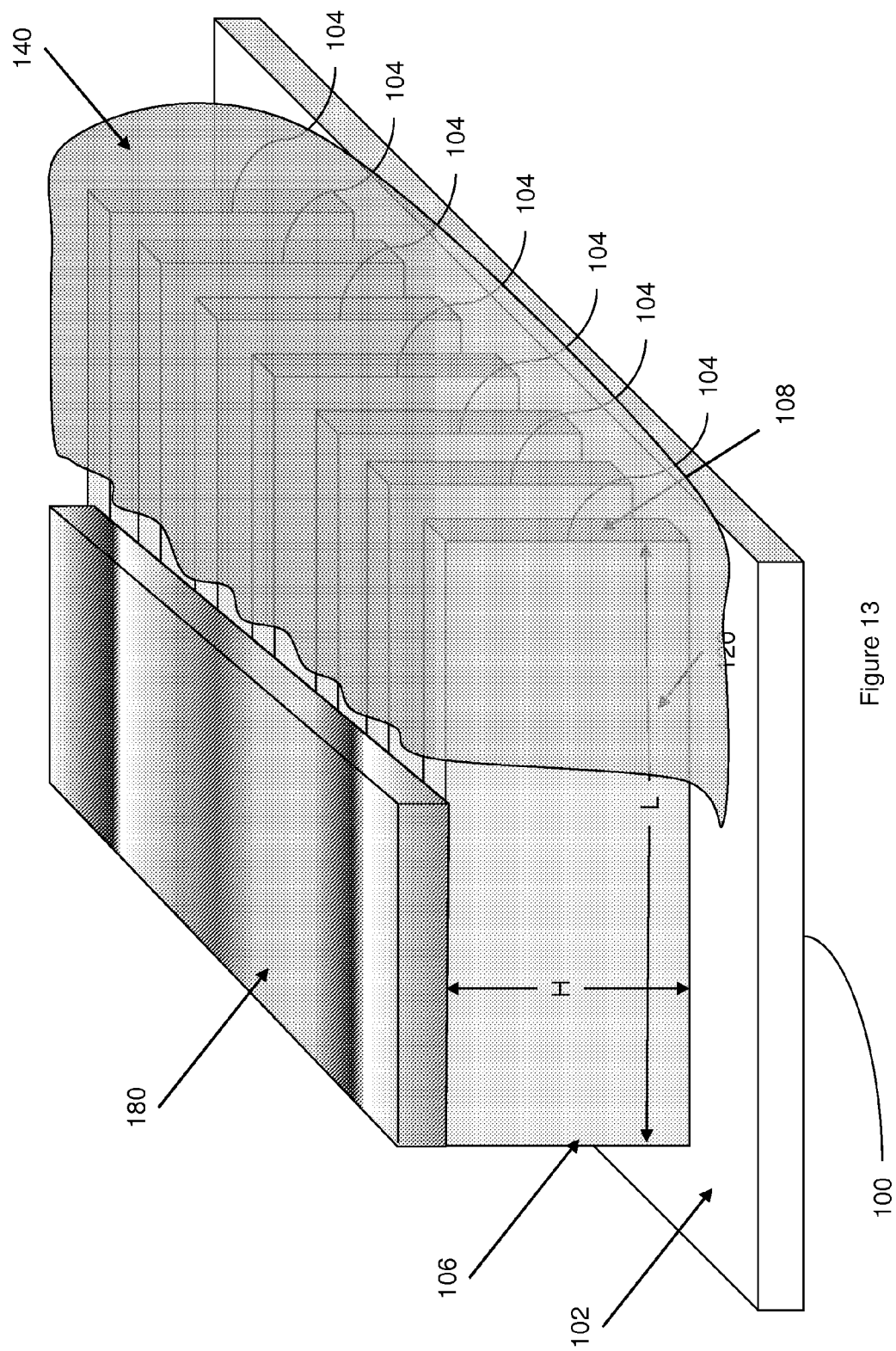
FIG. 13 is a schematic perspective diagram of a partially completed integrated circuit structure according to embodiments herein.
Figure 14:
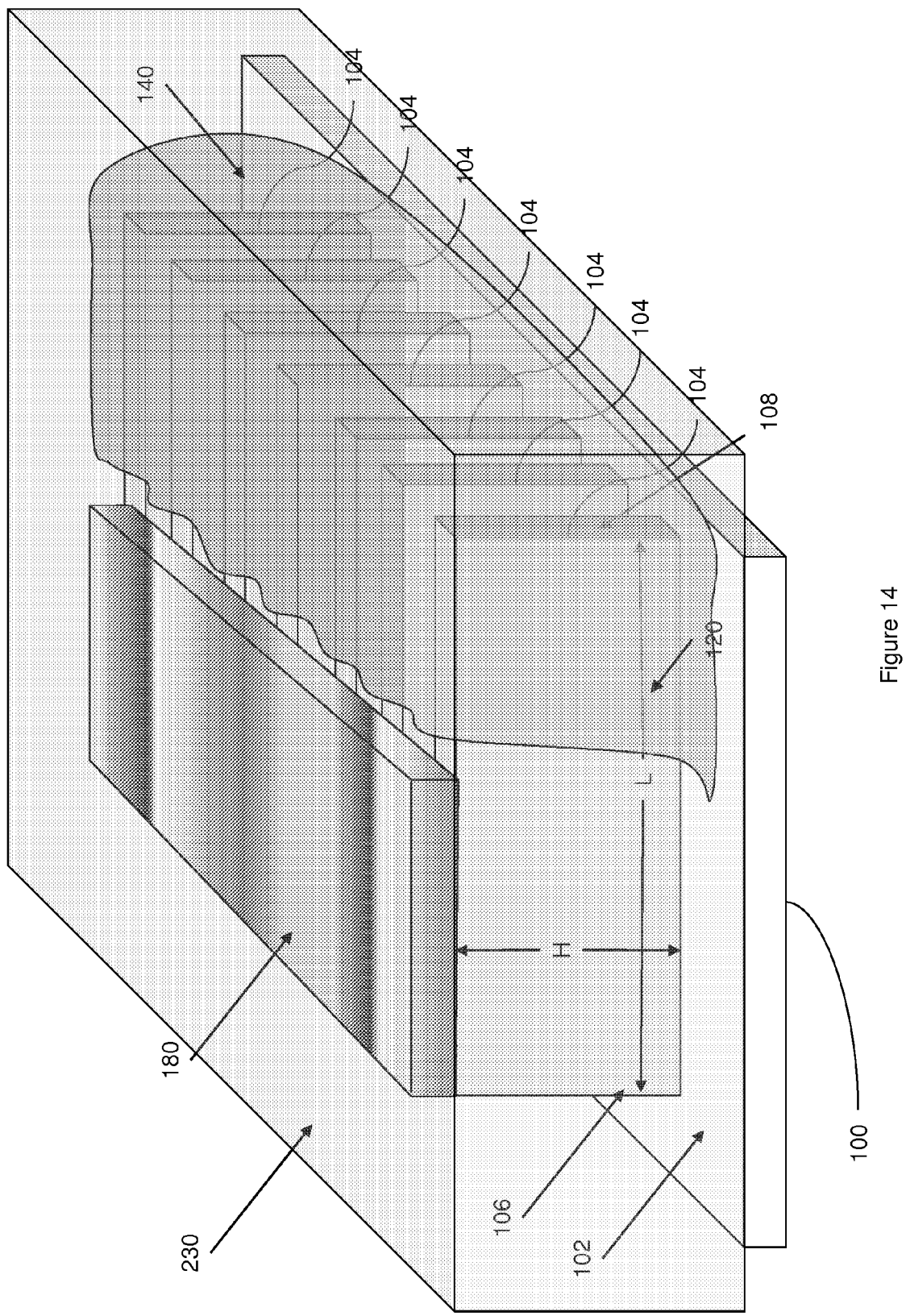
FIG. 14 is a schematic perspective diagram of a completed integrated circuit structure according to embodiments herein.
Figure 15:
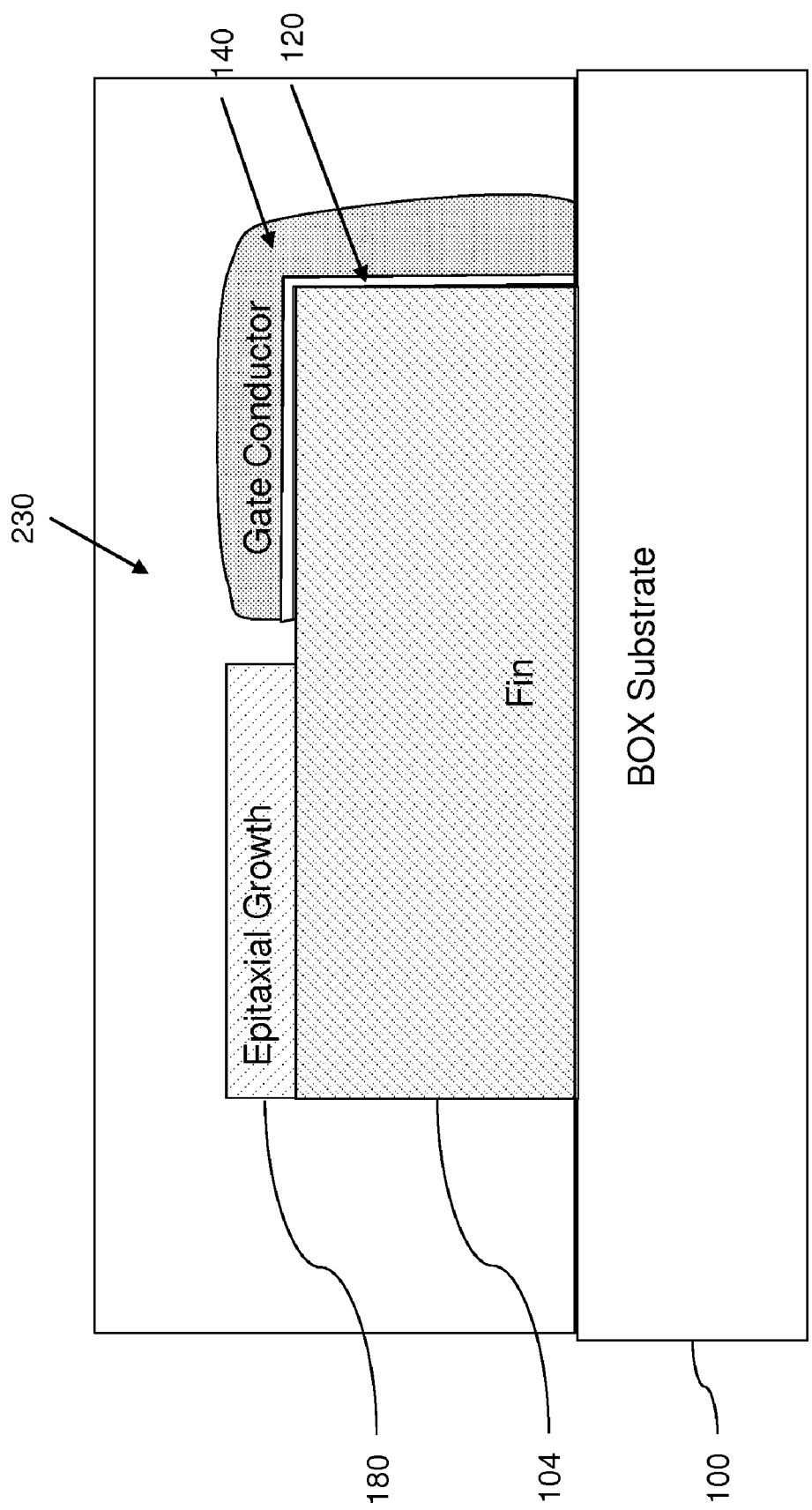
FIG. 15 is a schematic cross-sectional diagram of a completed integrated circuit structure according to embodiments herein.

As mentioned above, a number of different processing steps can be utilized to achieve the final structures mentioned herein. One such alternative process is illustrated in FIGS. 11-14. More specifically, FIG. 11 takes the structure from FIG. 6 and forms a mask 200 over the first conductor 140 (such as any of the masks mentioned above). Then, in FIG. 12, the second conductor 180 is formed using any of the processes discussed above. Next, in FIG. 13, the mask 200 is removed. As shown in FIG. 13, the mask 200 overlapped the first conductor 140 sufficiently to create a gap between the second conductor 180 and the first conductor 140. Then, as shown in FIG. 14, a larger conformal insulator 230 is deposited over the entire structure. As can be seen more clearly in the cross-sectional view of FIG. 15, the conformal insulator 230 prevents electrical connection between the second conductor 180 and the first conductor 140. This fuse would be similarly blown or programmed as is shown in FIG. 10.

Figure 16:
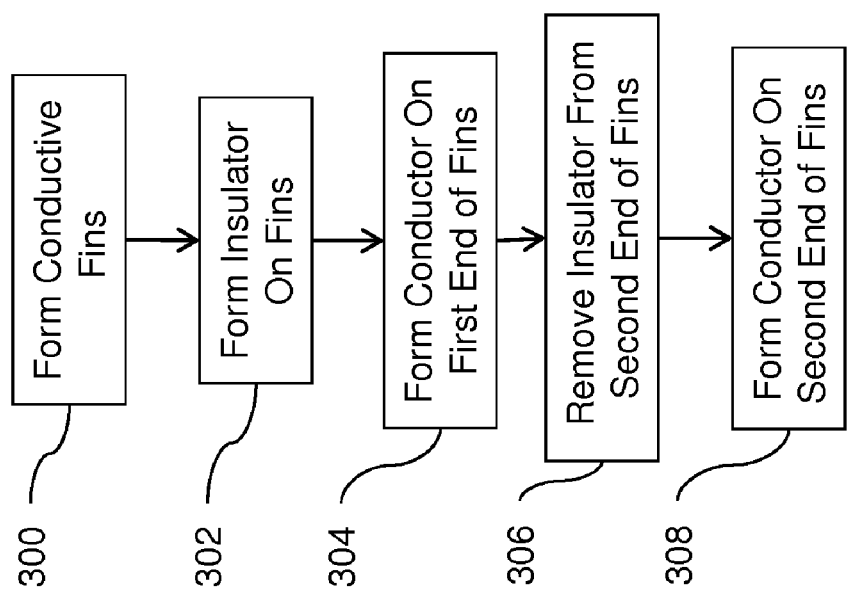
FIG. 16 is a flowchart illustrating method embodiments herein.

As shown in flowchart form in FIG. 16, methods of forming such an anti-fuse structure begin by patterning a plurality of parallel conductive fins on a substrate in item 300. This process is controlled as discussed above such that each of the fins is formed to have a rectangular prism shape (three-dimensional elongated cube shape) that comprises a length dimension parallel to the upper surface of the substrate a height dimension perpendicular to the length dimension, and a width dimension (W) perpendicular to the length dimension and to the height dimension. The rectangular prism shape is thin and elongated and, therefore, the length dimension is greater than the height dimension, and the height dimension is greater than the width dimension (W). The width dimension (W) contacts the upper surface of the substrate, and the length dimension of the fins has a second end and a first end.

The method forms an insulator on the fins in item 302 and forms a conductor (a "first" electrical conductor) on the insulator over the "first" end of the fins in item 304. The first electrical conductor is electrically insulated from the first end of the fins by the insulator. Then, the method removes the insulator from the second end of the fins in item 306 to expose the second end of the fins. In item 308, the method forms a different electrical conductor (a "second" electrical conductor) on the exposed "second" end of the fins.

The structure created is an anti-fuse, which is an insulator until programmed or blown, at which point it becomes a permanent conductor. Therefore, the insulator below the first electric conductor has a thickness sufficient to break down on the application of a predetermined voltage between the second electrical conductor and the first electrical conductor. Upon application of this sufficient "predetermined" voltage, the breaking down of the insulator forms an uninterrupted electrical connection between the second electrical conductor and the first electrical conductor through the fins.

Therefore, this disclosure shows a structure for an anti-fuse in fin technology, which takes advantage of field enhancement for low programming voltage. The present embodiments are compatible with conventional fin-type field effect transistor (FinFET) processing, are compact in size, and require a low programming voltage. The portion of the insulator located at the corner of the first end of the fin is the portion of the insulator that breaks down most easily. The geometry of the fin corner concentrates the heating action and promotes the insulator breakdown, which reduces the amount of voltage required to "blow" the anti-fuse. By reducing the amount of voltage required to blow the anti-fuse, the embodiments herein provide a substantial advantage over conventional anti-fuse structures.

The resulting integrated circuit chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

What is claimed is:

1. An anti-fuse structure comprising:
   a substrate;
   a plurality of parallel conductive fins positioned on said substrate, each of said fins having a first end and a second end;
   an insulator covering said first end of said fins;
   a first electrical conductor positioned on said insulator, said first electrical conductor being electrically insulated from said first end of said fins by said insulator; and
   a second electrical conductor electrically connected to said second end of said fins,
   said insulator having a thickness sufficient to break down on the application of a predetermined voltage between said second electrical conductor and said first electrical conductor and thereby form an uninterrupted electrical connection between said second electrical conductor and said first electrical conductor through said fins.

2. The anti-fuse structure according to claim 1, said insulator being positioned along sidewalls and a top of said fins.

3. The anti-fuse structure according to claim 1, said thickness of said insulator comprising a dimension that is less than 5% of a height of said fins.

4. The anti-fuse structure according to claim 1, said second electrical conductor and said first electrical conductor comprising different materials.

5. The anti-fuse structure according to claim 1, said second electrical conductor comprising a material epitaxially grown from said fins.

6. An anti-fuse structure comprising:
   a substrate having an upper surface;
   a plurality of parallel conductive fins positioned on said upper surface of said substrate, each of said fins having a rectangular prism shape comprising:
      a length dimension parallel to said upper surface;
      a height dimension perpendicular to said length dimension; and
      a width dimension perpendicular to said length dimension and to said height dimension, said length dimension being greater than said height dimension, and said height dimension being greater than said width dimension, said width dimension contacting said upper surface of said substrate, and said length dimension of said fins having a first end and a second end;
   an insulator covering said first end of said fins;
   a first electrical conductor positioned on said insulator, said first electrical conductor being electrically insulated from said first end of said fins by said insulator; and
   a second electrical conductor electrically connected to said second end of said fins,
   said insulator having a thickness sufficient to break down on the application of a predetermined voltage between said second electrical conductor and said first electrical conductor and thereby form an uninterrupted electrical connection between said second electrical conductor and said first electrical conductor through said fins.

7. The anti-fuse structure according to claim 6, said insulator being positioned along sidewalls and a top of said fins.

8. The anti-fuse structure according to claim 6, said thickness of said insulator comprising a dimension that is less than 5% of said height dimension of said fins.

9. The anti-fuse structure according to claim 6, said second electrical conductor and said first electrical conductor comprising different materials.

10. The anti-fuse structure according to claim 6, said second electrical conductor comprising a material epitaxially grown from said fins.

11. An anti-fuse structure comprising:
a substrate having an upper surface;
a plurality of parallel conductive fins positioned on said upper surface of said substrate, each of said fins having a rectangular prism shape comprising:
a length dimension parallel to said upper surface;
a height dimension perpendicular to said length dimension; and
a width dimension perpendicular to said length dimension and to said height dimension, said length dimension being greater than said height dimension, and said height dimension being greater than said width dimension, and said length dimension of said fins having a second end and a first end, each of said fins having a bottom surface connected to said upper surface of said substrate and a top surface opposite said bottom surface;
an insulator covering said first end of said fins, each of said fins having sides between said bottom surface and said top surface, said insulator covering said top surface and said sides of said first end of said fins;
a first electrical conductor positioned on said insulator, said first electrical conductor being electrically insulated from said first end of said fins by said insulator; and
a second electrical conductor electrically connected to said second end of said fins, said second electrical conductor being connected to said top surface of said second end of said fins,
said insulator having a thickness sufficient to break down on the application of a predetermined voltage between said second electrical conductor and said first electrical conductor and thereby form an uninterrupted electrical connection between said second electrical conductor and said first electrical conductor through said fins.

12. The anti-fuse structure according to claim 11, said insulator being positioned along sidewalls and a top of said fins.

13. The anti-fuse structure according to claim 11, said thickness of said insulator comprising a dimension that is less than 5% of said height dimension of said fins.

14. The anti-fuse structure according to claim 11, said second electrical conductor and said first electrical conductor comprising different materials.

15. The anti-fuse structure according to claim 11, said second electrical conductor comprising a material epitaxially grown from said fins.

16. A method of forming an anti-fuse structure comprising:
patterning a plurality of parallel conductive fins on a substrate, each of said fins having a first end and a second end;
forming an insulator on said fins;
forming a first electrical conductor on said insulator over said first end of said fins, said first electrical conductor being electrically insulated from said first end of said fins by said insulator;
removing said insulator from said second end of said fins to expose said second end of said fins; and
forming a second electrical conductor on said second end of said fins,
said insulator having a thickness sufficient to break down on the application of a predetermined voltage between said second electrical conductor and said first electrical conductor and thereby form an uninterrupted electrical connection between said second electrical conductor and said first electrical conductor through said fins.

17. The method according to claim 16, said forming of said insulator comprising positioning said insulator along sidewalls and a top of said fins.

18. The method according to claim 16, said forming of said insulator comprising a process that forms of said insulator to a thickness dimension that is less than 5% of a height of said fins.

19. The method according to claim 16, said forming of said second electrical conductor and said forming of said first electrical conductor comprising processes that utilizes different materials.

20. The method according to claim 16, said forming of said second electrical conductor comprising epitaxially growing said second electoral conductor from said fins.

21. A method of forming an anti-fuse structure comprising:
patterning a plurality of parallel conductive fins on a substrate, such that each of said fins has a rectangular prism shape comprising:
a length dimension parallel to said upper surface;
a height dimension perpendicular to said length dimension; and
a width dimension perpendicular to said length dimension and to said height dimension, said length dimension being greater than said height dimension, and said height dimension being greater than said width dimension, said width dimension contacting said upper surface of said substrate, and said length dimension of said fins having a first end and a second end;
forming an insulator on said fins;
forming a first electrical conductor on said insulator over said first end of said fins, said first electrical conductor being electrically insulated from said first end of said fins by said insulator;
removing said insulator from said second end of said fins to expose said second end of said fins; and
forming a second electrical conductor on said second end of said fins,
said insulator having a thickness sufficient to break down on the application of a predetermined voltage between said second electrical conductor and said first electrical conductor and thereby form an uninterrupted electrical connection between said second electrical conductor and said first electrical conductor through said fins.

22. The method according to claim 21, said forming of said insulator comprising positioning said insulator along sidewalls and a top of said fins.

23. The method according to claim 21, said forming of said insulator comprising a process that forms of said insulator to a thickness dimension that is less than 5% of a height of said fins.

24. The method according to claim 21, said forming of said second electrical conductor and said forming of said first electrical conductor comprising processes that utilizes different materials.

25. The method according to claim 21, said forming of said second electrical conductor comprising epitaxially growing said second electoral conductor from said fins.

* * * * *